United States Patent [19]

DiLorenzo et al.

[11] 3,890,215

[45] June 17, 1975

[54] ELECTROCHEMICAL THINNING OF SEMICONDUCTOR DEVICES

[75] Inventors: James Vincent DiLorenzo, Piscataway; William Charles Niehaus; Daniel Leon Rode, both of Murray Hill; Bertram Schwartz, Westfield, all of N.J.

[73] Assignee: Bell Telephone Laboratories, Incorporated, Murray Hill, N.J.

[22] Filed: Feb. 8, 1974

[21] Appl. No.: 440,664

[52] U.S. Cl. ................. 204/129.2; 29/580; 29/584; 29/586; 156/17; 204/129.1; 204/129.3; 204/129.43

[51] Int. Cl. ........................... B23p 1/00; H01l 7/00

[58] Field of Search.............. 204/329, 129.1, 129.2, 204/129.43; 29/580, 584, 586; 156/17

[56] References Cited

UNITED STATES PATENTS

| | | | |
|---|---|---|---|
| 3,112,554 | 12/1963 | Teszner | 29/571 |
| 3,226,798 | 1/1966 | Wolff, Jr. | 29/580 |
| 3,418,226 | 12/1968 | Marinale | 204/129.55 |
| 3,677,846 | 7/1972 | Theunissen et al. | 156/8 |
| 3,683,491 | 8/1972 | Nelson et al. | 29/571 |

FOREIGN PATENTS OR APPLICATIONS

| | | |
|---|---|---|
| 1,226,153 | 3/1971 | United Kingdom |

*Primary Examiner*—John H. Mack
*Assistant Examiner*—Aaron Weisstuch
*Attorney, Agent, or Firm*—L. H. Birnbaum

[57] ABSTRACT

A method for precisely tailoring the thickness of a layer of semiconductor material in a structure comprising regions of varying doping concentrations in order to achieve desired uniform electrical properties. The method involves, generally, electrolytically thinning the layer to remove the semiconductor material until a desired field distribution in the structure is reached. In one embodiment, an FET with an epitaxial layer on a semi-insulating substrate is manufactured by successively oxidizing the epitaxial layer and dissolving the oxide until the depletion region resulting from the applied potential extends into the semi-insulating substrate and oxide growth stops. This results in a uniform pinch-off condition along the layer regardless of the original non-uniformity in the epitaxial layer. In a further embodiment, the epitaxial layer in an IMPATT structure is thinned by successive oxidation and dissolution until the voltage dropped across the semiconductor is equal to the applied potential and again oxide growth stops. This procedure results in a desired uniform breakdown voltage for the wafer.

14 Claims, 10 Drawing Figures

ELECTROCHEMICAL THINNING OF SEMICONDUCTOR DEVICES

BACKGROUND OF THE INVENTION

This invention relates to a method of thinning semiconductor layers in accordance with desired electrical properties.

Production of semiconductor devices which are capable of operating at microwave frequencies presents a particularly acute problem. The problem is how to achieve uniform, thin layers of semiconductor material (usually below 1 micron) in a reproducible manner so as to consistently achieve devices operable at maximum efficiencies.

While this problem cuts across several device technologies, one area in which it has become particularly troublesome is in attempts to manufacture gallium-compound semiconductor unipolar devices, in particular GaAs devices. For example, work is progressing in producing GaAs MESFETs (Metal Semiconductor Field Effect Transistors) operable in the microwave range. The device comprises a semi-insulating region of GaAs on which is grown an epitaxial layer of n-type GaAs. Source and drain are formed by ohmic contacts and the gate by a Schottky diode on the surface of the epitaxial layer. Current is controlled by pinching off the layer with the reverse biased Schottky gate. It is therefore desirable to produce a layer which has a uniform pinch-off potential all along the surface in both single device processing and batch processing of several devices from a single layer. Another area of concern is in the manufacture of GaAs IMPATT devices (for Impact Ionization Avalanche Transit Time). The Hi-Lo IMPATT, for example, comprises a substrate of $n^{++}$-type GaAs on which is grown a layer of n-type GaAs (i.e., one with lower concentration of mobile charge than the substrate). Upon this layer is an $n^{+}$-type layer of GaAs (one with a concentration lying between those of the first layer and the substrate). As known in the art, such devices are operated by biasing into avalanche breakdown. It will therefore be seen that the fabrication of such classes of devices requires epitaxial layers which have a uniform breakdown voltage characteristic for consistency from device-to-device and slice-to-slice.

Attempts to fabricate thin layers with uniform breakdown or pinch-off potentials by standard epitaxial growth techniques have not met with consistent success. Apparently, the as-grown epitaxial layer has too great a non-uniformity in doping concentration and/or thickness along the layer to meet the close tolerances required for microwave devices. Typically, the best epitaxial growth techniques produce layers with $\pm 0.1\ \mu$ uncertainties in thickness and $\pm 10\%$ variations in doping concentrations. However, microwave devices generally require thickness uniformities in the range of $\pm 0.01\ \mu$. Previous chemical etching techniques do not alleviate this problem since the same uniformities in the original epitaxial layer will exist in the thinned layer.

It is therefore the primary object of the invention to provide a means of manufacturing layers of semiconductor material which have a predetermined uniform electric field distribution along the lateral dimension when the layer is reverse-biased into breakdown.

SUMMARY OF THE INVENTION

This and other objects are achieved in accordance with the invention. The starting epitaxial semiconductor layer is made at least as thick as the final desired electrical characteristics call for and preferably thicker to minimize tolerance problems. The layer is thinned by electrolytic means until a desired field distribution is achieved in the layer in a self-limiting fashion. In one embodiment, an epitaxial layer on a semi-insulating substrate designed for use in an FET is subjected to successive electrolytic oxidations and dissolution of the oxide until the depletion region resulting from the applied potential extends into the semi-insulating region whereupon oxide growth stops. This results in a uniform pinch-off condition along the layer. If desired, the layer can then be further thinned to below pinch-off condition by photostimulation. In a further embodiment, a multilayer IMPATT structure with a desired uniform breakdown voltage is manufactured by successive oxidation of the top layer and dissolution of the oxide until the voltage dropped across the semiconductor is equal to the applied potential and, again, oxidation ceases.

BRIEF DESCRIPTION OF THE DRAWING

These and other features of the invention are delineated in detail in the description to follow.

In the drawing.

DETAILED DESCRIPTION OF THE INVENTION

Figure 1A:
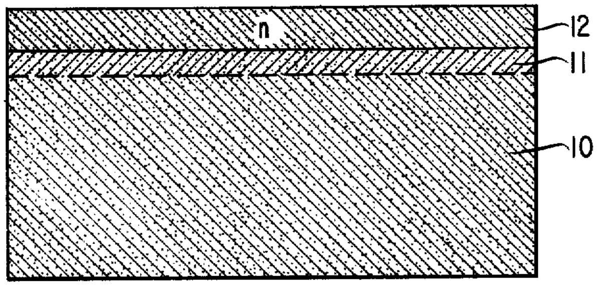
FIGS. 1A – 1D are cross-sectional views of a device during various stages of manufacture in accordance with one embodiment of the invention.

The basic principles of the invention will first be discussed in relation to the fabrication of a GaAs MESFET. The starting material is illustrated in FIG. 1A. The structure comprises a semi-insulating substrate 10 of GaAs upon which was formed a buffer layer of GaAs, 11, upon which was grown, by standard epitaxial growth techniques, an n-type epitaxial layer, 12, of GaAs. The substrate was Cr-doped to yield a resistivity of $10^7$ ohms-cum and had a thickness of approximately 10 mils. The buffer layer was similarly low-doped to a concentration less than $6 \times 10^{14}\ cm^{-3}$ and was approximately 1 $\mu$ in thickness. The purpose of the buffer layer is to insure a good quality material substrate for further epitaxy and for all purposes of this invention may be considered part of the substrate (as indicated by the broken line separation). The n-type layer of GaAs was sulfur-doped to a concentration of approximately $6 \times 10^{16}\ cm^{-3}$. This layer was purposely grown too thick to achieve pinch-off, in this case approximately $1.35\ \mu$ in thickness. The thickness necessary to achieve pinch-off for a particular potential will depend on the material used and the donor concentration. Such calculations are well-known in the art and consequently are not discussed.

The epitaxial layer is therefore subject to successive electrolytic oxidations and dissolution of the oxide to thin the layer down to a pinchable condition. The electrolytic system shown schematically in FIG. 2 was employed. (Such a system is described, for example, in U.S. patent application of B. Schwartz, Ser. No. 292,127, filed Sep. 25, 1972, and assigned to the present assignee, now U.S. Pat. No. 3,798,139. The liquid electrolyte, 18, is confined within an ordinary container, 17. In this embodiment, the electrolyte was a 30% aqueous solution of $H_2O_2$ with a pH adjusted to approximately 2.5 by $H_3PO_4$. It should be appreciated that this particular electrolyte is given by way of example, and any solution which is capable of electrolytically forming an oxide on the semiconductor material can be used. For example, water alone may be used as an electrolyte if it includes a source of ions to adjust the pH to within the range 1 – 5 and 9 – 13. (See application of Schwartz, supra.) The device, represented as block 19, is attached to an oxidizable metal, 21, such as Al and immersed in the electrolyte along with a wafer, 20, of a noble metal such as platinum, or a high purity carbon. Electrically coupled to these wafers is an adjustable d.c. voltage source 22 and current-limiting resistor 23 which represent a constant voltage source. It will be clear, however, that a constant current source with an adjustable maximum voltage could be utilized as well. The semiconductor, 19, is made the anode, and the electrode, 20, is made the cathode of the system. An ammeter, 24, and voltmeter, 25, may be included in the circuit for monitoring current and voltage, respectively.

Figure 1B:
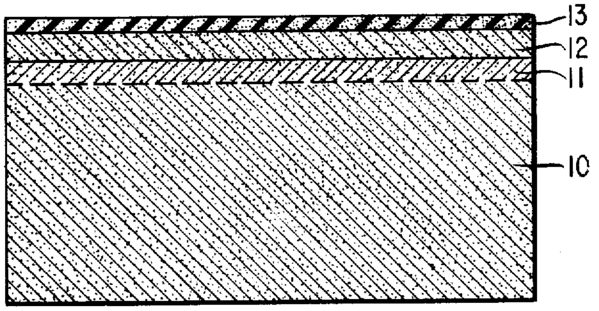
Figure 1C:
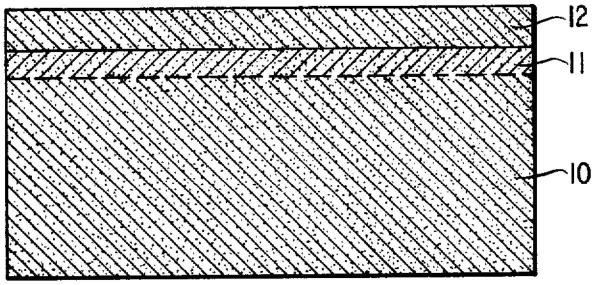

A constant potential of approximately 70 volts was applied to the cell. As a result, after about 10 minutes, an amorphous oxide, 13, approximately 1400 A. thick was grown into the surface of the epitaxial layer as illustrated in FIG. 1B. In general, a range of applied potential of approximately 5 – 175 volts should produce good, uniform oxides and at the rate of approximately 20 A./volt at room temperature. It has been found that approximately two-thirds of the oxide thickness is consumed GaAs material. Consequently, when the oxide was stripped off, the layer 12 had been thinned by about 950 A., as illustrated in FIG. 1C. (It will be appreciated that the amount of material removed has been exaggerated in the drawing.) The oxide was dissolved by removing the device from the solution and immersing it in HCl solution for approximately 10 seconds. Any solution which dissolves the oxide without etching the semiconductor could, of course, be utilized. In fact, if the electrolyte is $H_2O$ adjusted to a pH of 8 or above, the device may be left in the electrolyte and the oxide will dissolve simply by lowering the potential below what was applied to oxidize. (For a full discussion of this method, see U.S. patent application of F. Ermanis and B. Schwartz Case 3–20 filed on an even date herewith and assigned to the present assignee.)

Figure 1D:
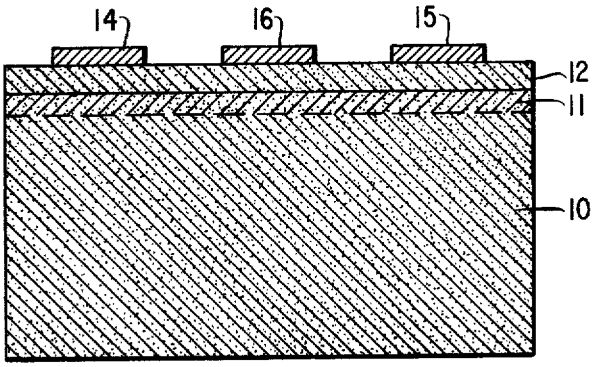
Figure 2:
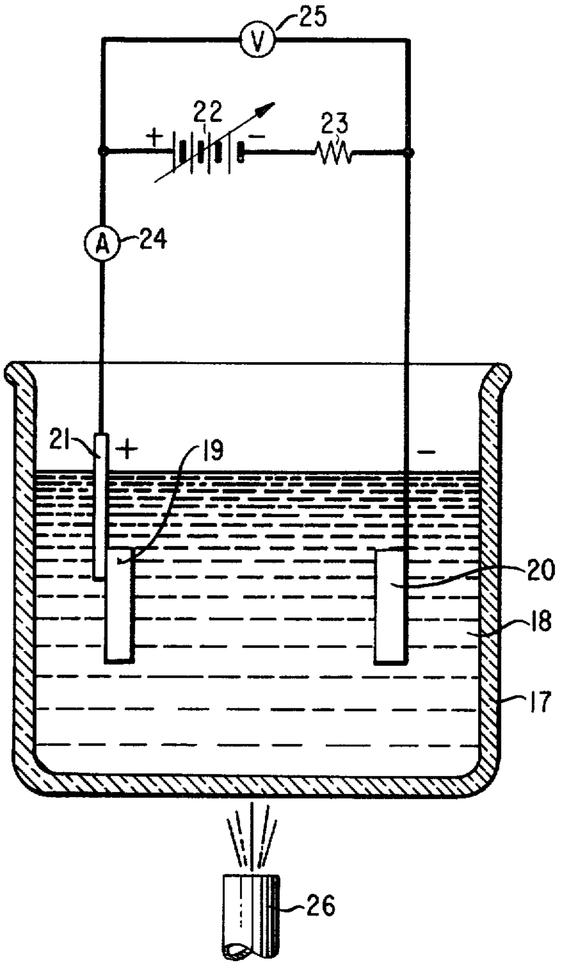
FIG. 2 is a schematic illustration of an electrolytic oxidation system for use in accordance with the same embodiment.

The procedure of oxidation and dissolution was repeated eight more times. During the last such oxidation, the oxide stopped growing when the thickness of the unconsumed layer 12 reached a pinchable condition all along the layer as explained below. This thickness was approximately 0.6 $\mu$. It is desirable for FET applications that the thickness of the layer be smaller (by about 0.2 $\mu$) than that which permits pinch-off to provide a voltage margin for gate-to-drain breakdown. In order to continue oxidation, therefore, a light source 26 as shown in FIG. 2 is directed at the semiconductor in order to generate current through the oxide by photostimulation. As known in the art, the light incident on the semiconductor will create free carriers (in this case electrons) by photon absorption. The current thereby generated in the semiconductor and oxide will cause further oxidation of the surface in spite of the fact that the external applied potential is insufficient by itself to oxidize. Five additional oxidations and dissolutions were therefore performed using photostimulation to achieve a final thickness of layer 12 of approximately 0.42 $\mu$. The device is then completed as shown in FIG. 1D by forming on the surface ohmic contacts 14 and 15 which constitute the source and drain, and forming a Schottky barrier contact 16 which operates as the gate. These metallizations are made according to known techniques.

Tests on the completed device show that the electron mobility is not significantly affected by the thinning procedure. It will be appreciated that in actual practice fewer oxidations may be performed for typical FETs.

Figure 3A:
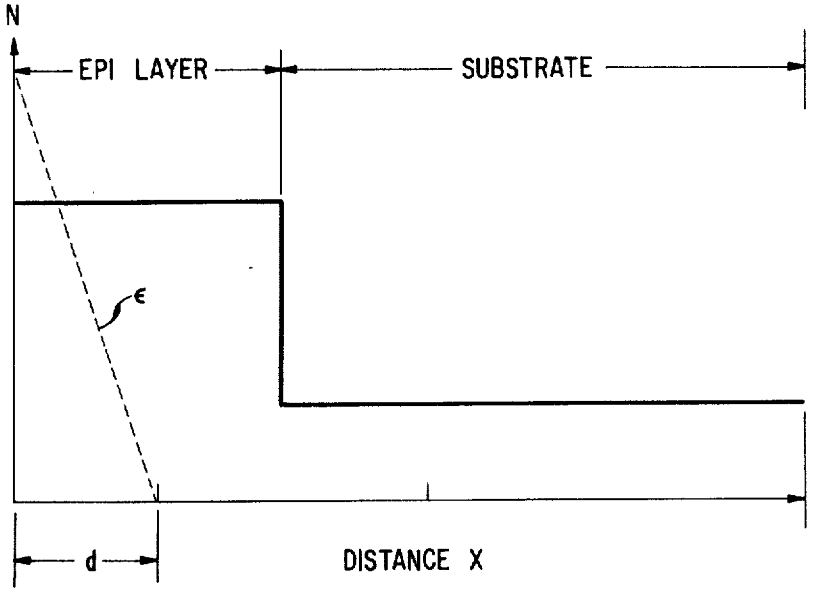
FIGS. 3A – 3B are profiles of the doping concentration and field distribution in a device during different stages of manufacture in accordance with the same embodiment.
Figure 3B:
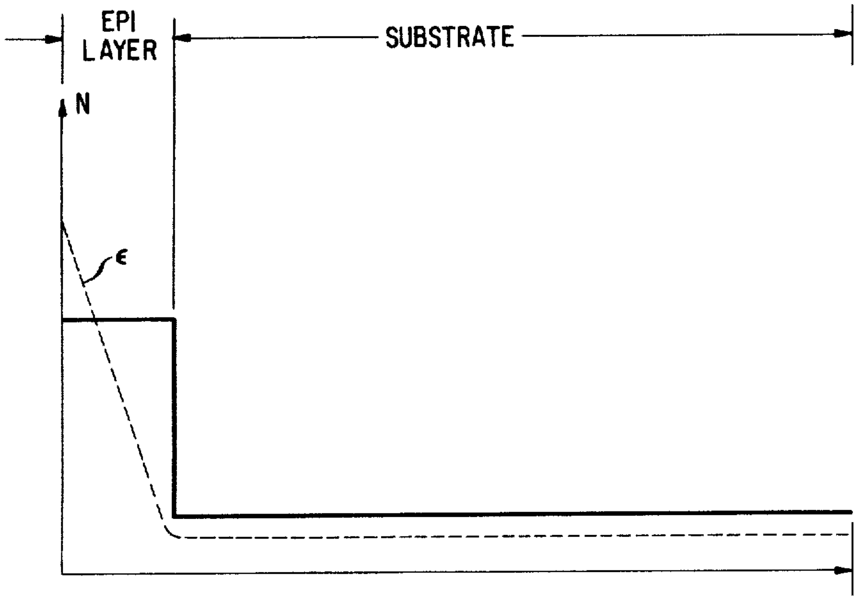

One of the surprising features of the invention is the fact that a uniform pinch-off condition is achieved regardless of localized nonuniformities in the doping concentration and thickness of the as-grown epitaxial layer. This phenomenon is explained by the fact that during electrolytic oxidation the oxide-semiconductor interface behaves like a reverse-biased Schottky contact and electron current originates at the interface by avalanche breakdown. FIG. 3A illustrates the electric field, $\epsilon$, (shown by the dashed line) produced in the semiconductor when a reverse-bias is applied for oxidation, superimposed on a drawing of donor density N as a function of distance, $x$, from the surface of the semiconductor. (In this drawing, the buffer layer is considered part of the substrate.) The resulting depletion region extends into the n-type epitaxial layer a distance, $d$, which is calculable according to known techniques. (See, for example, Sze, *Physics of Semiconductor Devices* (Wiley 1969) at p. 117.) At this point, negligible current flows in the semi-insulating substrate. As the layer is thinned according to the present invention, the depletion region moves closer to the substrate-epitaxial layer interface. When the layer is thinned to a value where the depletion region reaches the substrate, the pinch-off condition is achieved. This condition is illustrated in FIG. 3B. The applied potential will now be dropped across the substrate leaving insufficient voltage available to sustain avalanche breakdown at the surface and oxidation stops at this point. The process is therefore self-limiting. Furthermore, this electrical characteristic is a local phenomenon. Thus, oxide growth stops only on areas of the epitaxial layer which have locally achieved a pinch-off condition in accordance with local thickness and doping concentration. In other areas, oxide growth will continue until pinch-off is achieved for these local doping and thickness properties. Therefore, it is now possible to tailor an initially nonuniform layer to a desired field distribution which is uniform across the entire semiconductor wafer.

Utilizing the fact that the semiconductor behaves like a reverse-biased Schottky diode in the electrolytic system, and that the applied potential is divided into basically three components dropped across the semiconductor, the growing oxide, and the oxide-electrolyte interface, the following equation is derived from Ohm's Law and Faraday's Law:

$$V_{ox} = (V_a - V_b - V_s)\left(1 - \frac{R}{r+R}\right) \quad (1)$$

where $V_a$ is the voltage applied by the voltage source, $V_b$ is the voltage drop across the depletion region in the semiconductor (i.e., the breakdown voltage of the semiconductor), $V_{ox}$ is the voltage drop across the growing oxide, $V_s$ is the voltage drop across the interface between the oxide and the electrolyte, R is the resistance of the solution, and *r* is the resistance of the oxide. $V_{ox}$ may be thought of as the portion of the applied potential which is available for growing the oxide. When this value goes to a sufficiently low value, which is expected to be 10 volts or below, oxide growth stops. Thus, in the case of the FET, once the depletion region extends into the semi-insulating substrate, $V_b$ (the area under the field distribution curve in FIG. 3B) becomes very large and insufficient voltage is available to grow the oxide. It will be appreciated that this equation also applies to the case of constant current oxidations. In such embodiments, $V_a$ is given by:

$$V_a = KI^2t + IR \quad (2)$$

where K is a constant obtained from Faraday's Law, I is the applied current and *t* is time. In such embodiments, it will be realized that a constant current could be supplied until the voltage rises to a predetermined level and then shut off.

It is known that in the above-described particular embodiment, a native, amorphous oxide is formed on the surface of GaAs, the reaction apparently proceeding as follows:

$$GaAs + H_2O \rightarrow Ga_2O_3.H_2O + As_2O_3.H_2O \quad (3)$$

It is also known that a similar oxide will be formed with an electrolyte of water alone with the pH adjusted to 1 – 5 or 9 – 13 (application of B. Schwartz, Ser. No. 292,127, supra) or with water alone having a pH of 5 – 9 if a conductivity modifier such as $(NH_4)_{3-x} H_x PO_4$ where $x = 0 - 2$ is added. (See U.S. patent application of F. Ermanis and B. Schwartz Case 4–25 filed on an even date herewith and assigned to the same assignee, now abandoned.) Since the properties of the oxide result from the mixture of the product of the group III and group V elements, it is expected that similar oxides can be grown on all III–V compound semiconductors including ternary and quaternary compounds using the $H_2O_2$ or $H_2O$ electrolytes. Thus, while GaAs is a particularly suitable material for this invention, other useful materials include GaP, AlGaAs, AlGaP, InGaP, InGaAs, GaAsP, InSb, InAs and mixtures thereof.

It will be further appreciated that the invention may be applied to proper structures comprising any semiconductor material with a choice of suitable electrolytes for electrolytic oxidation.

In its broadest aspect the invention involves thinning a semiconductor material by reverse-biasing the surface to achieve avalanche breakdown so that a desired electric field is produced in a self-limiting fashion. Thus, although the invention is directed primarily to a successive oxidation and dissolution of the oxide, it is conceivable that similar results can be obtained by a straight electrochemical etching, i.e., one where the oxide is dissolved as fast as it is formed. For example, an electrochemical etch might be performed on the GaAs FET by using an HCl or $HNO_3$ solution as the electrolyte. To the best of applicants' knowledge, prior art electrochemcial etches have relied on etching which stops at or before the boundary between two layers of different conductivity type or at the boundary of layers with substantial differentials in doping concentration. They have not taught that a self-limiting process can be employed on multi-layer structures of the same conducitivity type where the process stops at a desired field distribution short of reaching the boundary.

Figure 4:
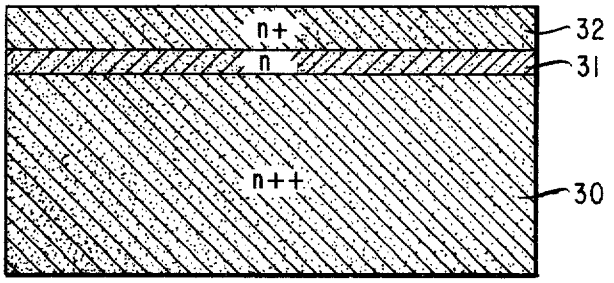
FIG. 4 is a front view of a device which may be treated in accordance with a further embodiment of the invention.

It will also be appreciated that the basic invention may be applied to many device applications to achieve a desired field distribution. One such structure is the Hi-Lo IMPATT device, one form of which is shown in FIG. 4. The device comprises an $n^{++}$-type GaAs substrate, 30, which is sulfur or silicon-doped to a concentration of approximately $5 \times 10^{17}$ $cm^{-3}$ and is approximately 10 mils thick. Formed therein by epitaxial growth techniques is a layer of n-type GaAs, 31, which is silicon-doped to a concentration of about $2 \times 10^{15}$ $cm^{-3}$ and has a thickness of approximately $5\mu$. The top layer, 32, is $n^+$-type which is sulfur-doped to a concentration of about $4 \times 10^{16}$ $cm^{-3}$. Again, it is extremely difficult to grow this layer to the precise thickness and doping concentration required for uniform frequency devices along a slice and from slice-to-slice. Consequently, the layer is grown at least as thick as would be required for device operation. In this case, the initial thickness was approximately $0.9\mu$.

The objective in fabrication of these devices is to achieve an electric field distribution in the hi-doped layer 32 and low-doped layer 31 for a particular frequency operation. It is known that the field is a function of the breakdown voltage, doping concentration, and thickness in each of the layers which the depletion width encompasses when the surface is reverse-biased by a Schottky contact. In particular, referring to FIG. 5A, which illustrates the doping and field profile when an initial voltage is applied, the breakdown voltage is the area under the $\epsilon$ curve, which at the initial stage is too low. Thus, as seen from Eq. (1), by a proper choice of applied potential $V_a$, the structure can be successively oxidized and etched in accordance with the invention until a desired breakdown voltage $V_b$ is reached and the process automatically stops.

Figure 5A:
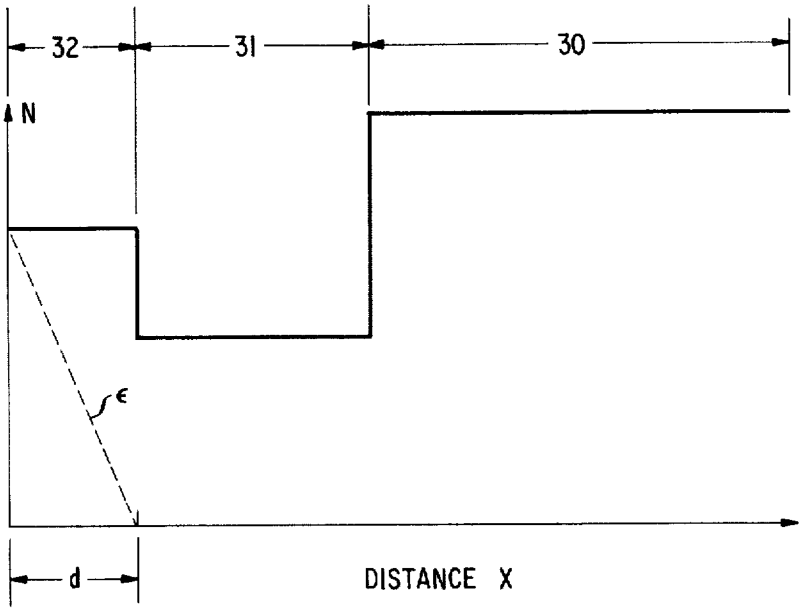
FIGS. 5A – 5B are profiles of the doping concentration and field distribution in the device during different stages of manufacture in accordance with the same embodiment.
Figure 5B:
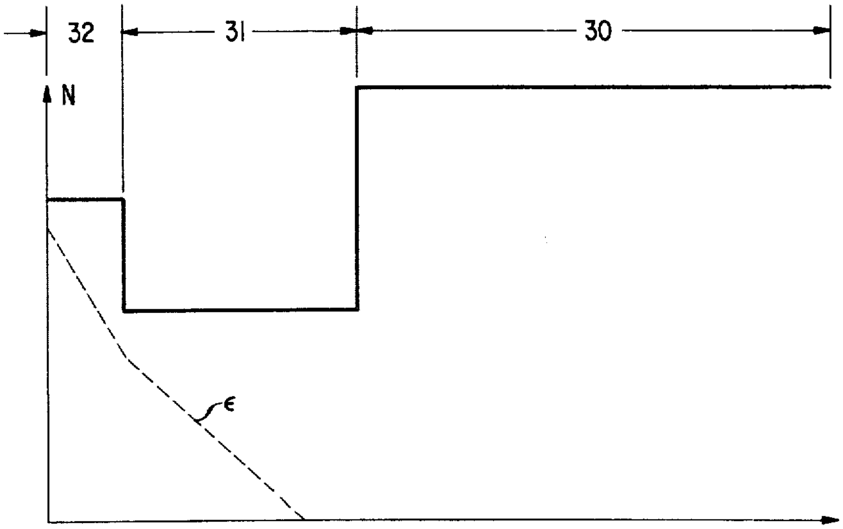

Once again, therefore, the structure was made the anode in an electrolytic system as in FIG. 2 where the electrolyte this time was $H_2O$ adjusted to a pH of approximately 2.5 by $H_3PO_4$. In this system $V_s << V_{ox}$ and $V_s$ may be ignored. Consequently, the applied potential is simply set to the value of the desired breakdown voltage, which in this example was 35 volts. (FIG. 5A illustrates the doping and field profiles at this stage.) After approximately 10 minutes, an initial oxide approximately 700 A. thick was grown into the surface of the layer 32. The oxide was dissolved in an HCl solution in approximately 10 seconds, resulting in a thinning of the surface by approximately 460 A. The process was then repeated several times. As the layer was thinned, the depletion region moved into the low-doped region resulting in a change in the field distribution which caused the breakdown voltage to increase. At same stage, the field profile reaches a desired value as shown in FIG. 5B where the breakdown voltage has increased to a value which is equal to approximately 35 volts and oxidation ceases. In this example, termination was reached on the seventh oxidation and the final thickness of the hi-doped layer was 0.54$\mu$. Once again, this is a local phenomenon and oxidation will cease at areas of the semiconductor which have locally achieved the desired breakdown in accordance with local doping and thickness, while the remainder of the semiconductor surface will continue to oxidize until the uniform breakdown characteristic is achieved across the entire wafer. It will be noted in processing this IMPATT structure that the applied potential was set approximately equal to the desired breakdown whereas in the case of the FET the applied potential may be set at some arbitrary value depending only upon the length of time for processing desired. If desired, of course, the initial applied potential could be set at a higher value to consume more material in a shorter period of time. However, care must be taken in being sure that too much material is not removed, which would result in a breakdown greater than desired. That is, at some point, when the material has thinned down too close to the desired breakdown, the applied potential should be lowered to the value of the desired breakdown so that the process will shut itself off.

It should also be realized that when a Pt Schottky contact is formed on the final structure, some additional material will be consumed resulting in an increase of the breakdown of the ultimate device. Therefore, in the present method, the breakdown achieved should be less than the ultimate breakdown sought for the final device. The differential caused by the contact is easily calculated according to known techniques and consequently not discussed.

The wafer in the above embodiment was processed into several devices designed to achieve a final device breakdown of 60 volts (which took into account the effects of forming the contact on the device). Measurement showed that the breakdown voltages were 58 ± 8 volts and the devices had frequencies of 6.6 ± 0.2 GHz with output power of 4.2 ± 0.7 watts and efficiencies of 18.2 ± 1.1%. The process was therefore proved capable of fabricating consistently good devices.

It will be realized that further structures may be processed in the same manner. For example, the Lo-Hi-Lo IMPATT has an additional layer of low-doped material on top of the hi-doped layer and this additional layer in such a structure could be thinned according to the present technique. Therefore, in general, it may be said that the inventive method may be applied to any semiconductor with at least two adjacent layers of the same conductivity type but different impurity concentrations (i.e., a ratio of higher concentration to low concentration of at least 1.2) where it is desired to remove a portion of the surface layer and where removal of said portion will give a higher breakdown voltage than the original structure.

Various additional modifications will become apparent to those skilled in the art. All such variations which basically rely on the teachings through which the invention has advanced the art are properly considered within the spirit and scope of the invention.

What is claimed is:

1. A method for thinning a layer of semiconductor material of one conductivity type with a first impurity concentration in a structure which includes adjacent thereto a semiconductor material of the same conductivity type with a second impurity concentration comprising the steps of:

making the structure the anode in an electrolytic cell wherein the electrolyte is capable of growing an oxide into the surface of the layer upon the application of a potential to said cell;

applying a constant potential to said structure so as to form an electric field distribution in said structure to create a current through said layer sufficient to form an oxide into the surface of said layer;

dissolving the oxide formed by said electrolyte thereby removing a portion of said layer; and repeating the oxidation and dissolution of the oxide until the current through said layer is insufficient to form said oxide into said layer when said potential is applied as the result of a predetermined electric field distribution being reached uniformly along the major portion of the surface of said layer.

2. The method according to claim 1 wherein the semiconductor material is selected from the group consisting of GaAs, GaP, AlGaAs, AlGaP, InGaP, InGaAs, GaAsP, InSb, and InAs.

3. The method according to claim 1 wherein the semiconductor material is GaAs.

4. The method according to claim 1 wherein the oxide is grown and dissolved in situ in the electrolyte.

5. The method according to claim 4 wherein the electrolyte comprises $H_2O$ and a source of hydroxyl ions sufficient to the pH of the solution to at least 8.

6. The method according to claim 1 wherein the ratio of the first to second impurity concentrations is at least 1.2.

7. The method according to claim 1 wherein the electrolyte is selected from the group consisting of $H_2O$ containing added ions for conductivity and an aqueous solution of $H_2O_2$.

8. A method for thinning a layer of semiconductor material of one conductivity type with a frist impurity concentration which is disposed over a substrate of semiconductor material of the same conductivity type with a second impurity concentration which is less than said first concentration comprising the steps of:

making the structure the anode in an electrolytic cell wherein the electrolyte is capable of growing an oxide into the surface of said layer upon the application of a potential to said cell;

applying a constant potential to said structure so as to form a depletion region in said layer to create a current through said layer sufficient to form an oxide into the surface of said layer;

dissolving the oxide formed by said electrolyte thereby removing a portion of said layer; and repeating the oxidation and dissolution of the oxide until the current through said layer is insufficient to form said oxide into said layer when said potential is applied as the result of said depletion region extending into said substrate along the major portion of the surface of said substrate resulting in a pinchable condition along the major portion of the surface of said layer.

9. The method according to claim 8 wherein the ratio of the first to second impurity concentrations is at least 1.2.

10. The method according to claim 8 wherein the electrolyte is selected from the group consisting of $H_2O$ containing added ions for conductivity and an aqueous solution of $H_2O_2$.

11. A method for thinning a first outer layer of semiconductor material of one conductivity type with a first impurity concentration in a structure which includes a second intermediate layer of semiconductor material of the same conductivity type with a second impurity concentration disposed over a substrate of semiconductor material of the same conductivity type with a third impurity concentration which is greater than said first and second impurity concentrations comprising the steps of:

making the structure the anode in an electrolytic cell wherein the electrolyte is capable of growing an oxide into the surface of said first layer upon the application of a potential to said cell;

applying a constant potential to said structure which is approximately equal to a desired breakdown potential for the structure so as to form an electric field distribution in said structure to create a current through said first layer sufficient to form an oxide into the surface of said layer;

dissolving the oxide formed by said electrolyte thereby removing a portion of said first layer; and repeating the oxidation and dissolution of the oxide until the current through said first layer is insufficient to form an oxide into said layer when said potential is applied resulting in said desired breakdown potential being reached in the structure uniformly along the major portion of the surface of said layer.

12. The method according to claim 11 wherein said first layer is disposed adjacent to said second layer and said first impurity concentration lies between said second and said third impurity concentrations.

13. The method according to claim 12 wherein the ratio of the first and second impurity concentrations is at least 1.2 and the ratio of the third and second impurity concentrations is also at least 1.2.

14. The method according to claim 11 wherein the structure further comprises a third layer of semiconductor material disposed between said first and second layers which layer has a fourth impurity concentration which lies between said first impurity concentration and said third impurity concentration.

* * * * *

UNITED STATES PATENT AND TRADEMARK OFFICE

CERTIFICATE OF CORRECTION

PATENT NO. : 3,890,215

DATED : June 17, 1975

INVENTOR(S) : James V. DiLorenzo, William C. Niehaus, Daniel L. Rode and Bertram Schwartz It is certified that error appears in the above-identified patent and that said Letters Patent are hereby corrected as shown below:

In the Specification, Column 2, line 54, "ohms-cum" should read --ohms-cm--. Column 3, line 10, "3,798,139. The" should read --3,798,139). The--. Column 6, line 26, after "$n^+$-type" insert --GaAs--. Column 7, line 5, "0.54" should read --0.5μ--. Column 8, line 31, after "sufficient to" insert --adjust--. Column 8, line 40, "frist" should read --first--.

Signed and Sealed this

*fourteenth* Day of *October 1975*

[SEAL]

*Attest:*

RUTH C. MASON
*Attesting Officer*

C. MARSHALL DANN
*Commissioner of Patents and Trademarks*